(12) United States Patent
Yeh

(10) Patent No.: US 9,293,447 B2
(45) Date of Patent: Mar. 22, 2016

(54) LED THERMAL PROTECTION STRUCTURES

(75) Inventor: Wei-Yu Yeh, Tainan (TW)

(73) Assignee: EPISTAR CORPORATION, Hsinchu (TW)

( * ) Notice: Subject to any disclaimer, the term of this patent is extended or adjusted under 35 U.S.C. 154(b) by 284 days.

(21) Appl. No.: 13/353,572

(22) Filed: Jan. 19, 2012

(65) Prior Publication Data

US 2013/0187571 A1 Jul. 25, 2013

(51) Int. Cl.
| | |
|---|---|
| *H05B 37/02* | (2006.01) |
| *H01L 33/64* | (2010.01) |
| *H01L 25/16* | (2006.01) |
| *H05B 33/08* | (2006.01) |

(52) U.S. Cl.
CPC ............ *H01L 25/167* (2013.01); *H05B 33/089* (2013.01); *H01L 33/64* (2013.01); *H01L 2924/0002* (2013.01); *Y02B 20/341* (2013.01)

(58) Field of Classification Search
USPC .............. 315/32, 50, 112, 113, 117, 118, 309
See application file for complete search history.

(56) References Cited

U.S. PATENT DOCUMENTS

| | | | | |
|---|---|---|---|---|
| 5,024,535 | A * | 6/1991 | Winston, Jr. ................. | 374/178 |
| 6,313,589 | B1 * | 11/2001 | Kobayashi et al. ............ | 315/309 |
| 7,626,346 | B2 * | 12/2009 | Scilla ............................ | 315/309 |
| 8,299,716 | B2 * | 10/2012 | Melzner et al. ............... | 315/113 |
| 2010/0176746 | A1 * | 7/2010 | Catalano et al. ............. | 315/297 |

OTHER PUBLICATIONS

Unpublished U.S. Appl. No. 13/287,171, filed Nov. 2, 2011 entitled Thermal Protection Structure for Multi-Junction LED Module, 32 pages.

* cited by examiner

*Primary Examiner* — Douglas W Owens
*Assistant Examiner* — James H Cho
(74) *Attorney, Agent, or Firm* — Muncy, Geissler, Olds & Lowe PC

(57) ABSTRACT

The present disclosure discloses an apparatus for thermally protecting an LED device. The apparatus includes a substrate. A light-emitting device disposed on a first region of the substrate. The apparatus includes a thermistor disposed on a second region of the substrate. The second region is substantially spaced apart from the first region. The thermistor is thermally and electrically coupled to the light-emitting device. The present disclosure also discloses a method of thermally protecting an LED device. The method includes providing a substrate having a light-emitting diode (LED) die disposed thereon. The method includes detecting a temperature of the LED die using a negative temperature coefficient (NTC) thermistor. The NTC thermistor is positioned on a region of the substrate substantially away from the LED die. The method includes adjusting an electrical current of the LED die in response to the detecting.

14 Claims, 9 Drawing Sheets

| Temperature °C | LED current | Current of thermistor |
|---|---|---|
| 25° | 684 mA | 16 mA |
| 35° | 677 mA | 23 mA |
| 45° | 667 mA | 33 mA |
| 55° | 655 mA | 45 mA |
| 65° | 641 mA | 59 mA |
| 75° | 622 mA | 78 mA |
| 85° | 599 mA | 101 mA |

Fig. 4

| Temperature °C | Output voltage |
|---|---|
| 25° | 0.13 V |
| 35° | 0.22V |
| 45° | 0.30V |
| 55° | 0.37V |
| 65° | 0.42V |
| 75° | 0.47V |
| 85° | 0.51V |

Fig. 8

LED THERMAL PROTECTION STRUCTURES

BACKGROUND

Light-emitting diode (LED) devices have experienced rapid growth. LED devices have been referred to as a new generation light source, one capable of replacing incandescence lamps, fluorescent lamps and high-intensity discharge lamps. When compared to incandescence light sources, LED devices offer advantages such as reduced power consumption, longer lifetime, faster response speed, more compact size, lower maintenance costs, and greater reliability. LED devices have thus found many applications, including backlighting for displays, automotive lighting, general lighting, and flash for mobile cameras.

Thermal management for LED devices, especially for high bright LED devices (HBLEDs) is important to these LED devices' performance and lifetime. Thermal management may be implemented by techniques of enhancing heat dissipation and reducing heat production. To enhance heat dissipation, developments have been made in areas such as heat sink, printed circuit board (PCB) as well as LED packaging. To minimize heat generated by an LED device's immediate surroundings, techniques such as separating LED drive circuitry from an LED board have been implemented. The total power input for an LED device is the product of the forward AC voltage and the forward current of the LED device. A portion of the total power is the power to an LED device, which is a sum of the light generated by the LED device and the heat dissipated by the LED device. To minimize heat generated by an LED device, approaches such as using a constant current regulator have been explored. However, conventional techniques of protecting LED devices at high temperature operation have not been satisfactory in all respects. For example, detecting LED temperature accurately brings challenges in thermal management. Therefore, improved techniques of protecting LED device at high temperature operations continue to be sought. Input power is converted to light and heat. LED and phosphor efficiency for converting power to light goes down when they are hot. When efficiency goes down, more of the input power goes to heat, which makes the LED hotter. At high temperatures, the LED is damaged.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a table showing a relationship between electrical current v.s. temperature for a thermistor.

FIG. 8 is a table showing a relationship between electrical current v.s. temperature for a thermistor.

DETAILED DESCRIPTION

It is to be understood that the following disclosure provides many different embodiments, or examples, for implementing different features of the invention. Specific examples of components and arrangements are described below to simplify the present disclosure. These are merely examples and are not intended to be limiting. It is also understood that spatially relative terms are intended to encompass different orientations of the device in use or operation in addition to the orientation depicted in the figures. In addition, various features may be arbitrarily drawn in different scales for simplicity and clarity. Moreover, although LED devices have been discussed herein, one of ordinary skill in the art would recognize that aspects of the present disclosure are applicable to other types of photonic devices as well.

Figure 1:
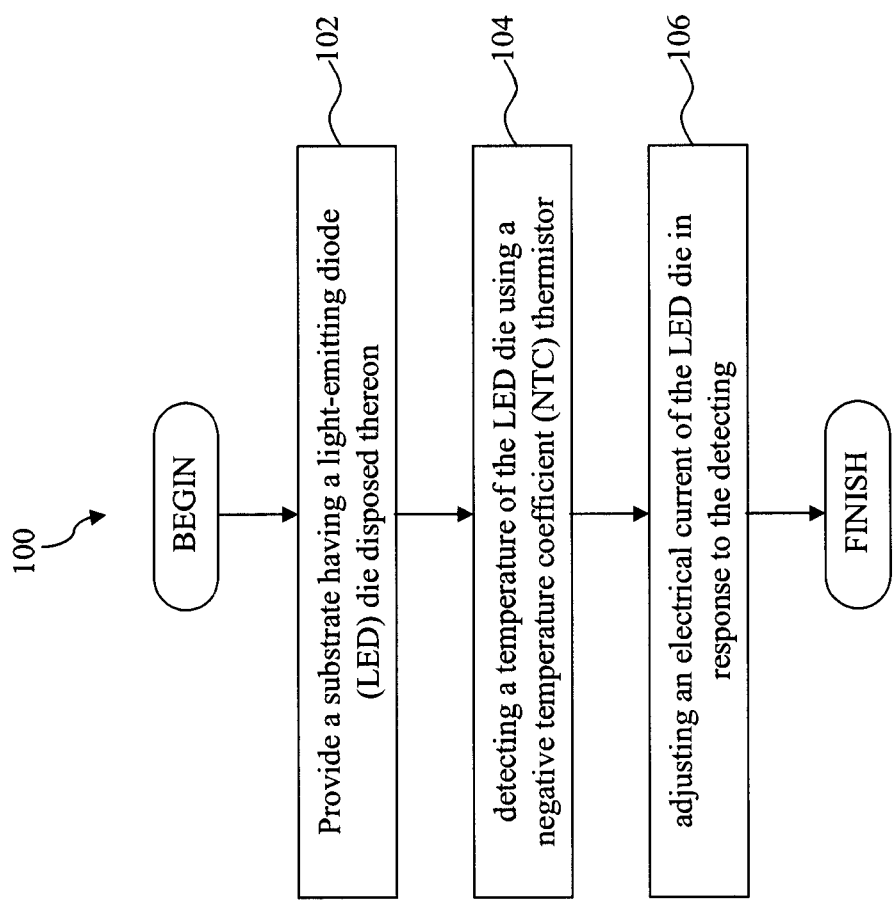
FIG. 1 is a flow chart of a method of protecting an LED device at high temperature operation according to various aspects of the present disclosure.

FIG. 1 is a flow chart of a method 100 of protecting an LED device at high temperature operations in accordance with various aspects of the present disclosure. The method 100 includes block 102, in which a substrate is provided. The substrate has a light-emitting diode (LED) die disposed thereon. The method 100 includes block 104, in which a temperature of the LED die is detected using a negative temperature coefficient (NTC) thermistor. The NTC thermistor is positioned on a region of the substrate substantially away from the LED die. The method 100 include block 106, in which an electrical current of the LED die is adjusted in response to the detecting performed in block 104. It is understood that additional processes may be performed before, during, or after the method 100, and that other processes may only be described briefly herein.

The paragraphs below in combination with FIGS. 2-5 will describe a "passive" approach of protecting LED devices at high temperature operations. The paragraphs below in combination with FIGS. 6-9 will describe an "active" approach of protecting LED devices at high temperature operations. It is understood that various aspects of the figures herein have been simplified for ease of understanding of the inventive concepts. Also, devices and circuitries of these figures may include additional elements not specifically illustrated and/or may illustrate elements that are omitted in other embodiments.

A Passive Method of Protection

Figure 2:
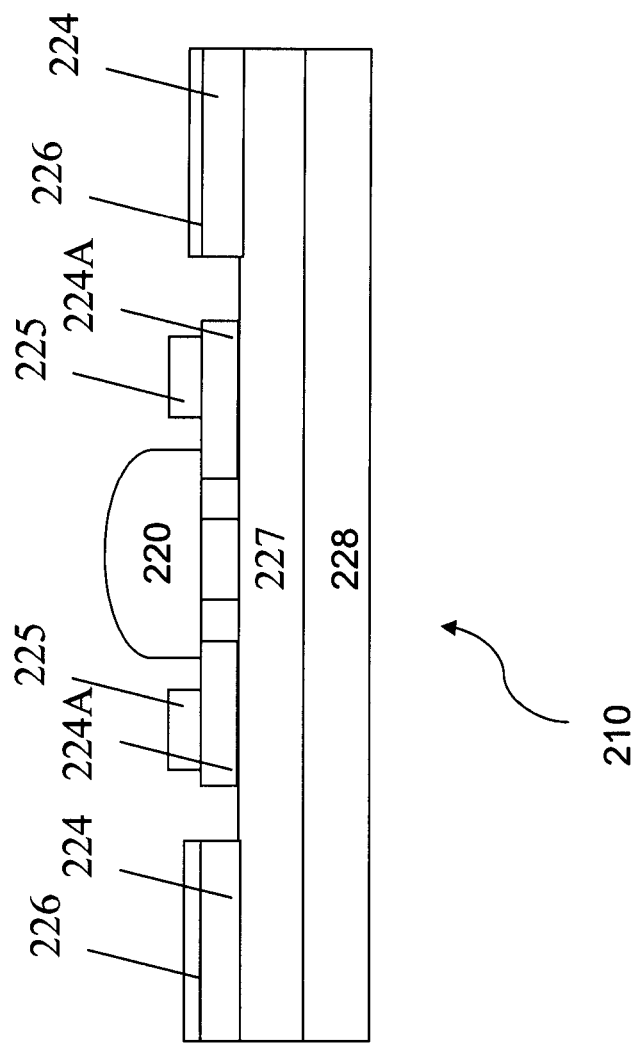
FIG. 2 is a simplified diagrammatic cross-sectional view of a portion of an embodiment of an LED thermal protection structure according to various aspects of the present disclosure.

FIG. 2 illustrates a diagrammatic fragmentary cross-sectional side view of a printed circuit board (PCB) 210 on which an LED device 220 is located. A thermal interface material (TIM, not illustrated herein) may be disposed between the LED device 220 and the PCB 210 to enhance thermal conductivity and adhesion. The TIM (thermal interface material) may include epoxy, thermal grease, and silicon or silicon (epoxy) with metal particles. The PCB 210 may provide a mechanism for electrical connections to the LED device 220, such as conductive traces operable to deliver a voltage or current to the LED device 220, and to circuitry or components associated with the LED device 220. The PCB 210 may be laminated with epoxy resin material with conductive lines formed therein. The PCB 210 may further include one or more embedded conductive plates to be incorporated in the conductive lines to enhance coupling integrity of the power and ground lines. Conductive plates are formed from metal, such as copper foil, and are patterned such that they are properly coupled to the power and ground lines.

In the depicted embodiment, the PCB 210 includes a metal core PCB (MC-PCB). The MC-PCB may be a copper-type MC-PCB. In an alternative embodiment, the MC-PCB is an aluminum-type MC-PCB. In other embodiments, a PCB having FR4, and/or other suitable PCB type may be used depending on design and/or cost constraints. The MC-PCB may provide for thermal management for the LED device 220 to allow a path for heat dissipation through a backside of the LED device 220.

Figure 3:
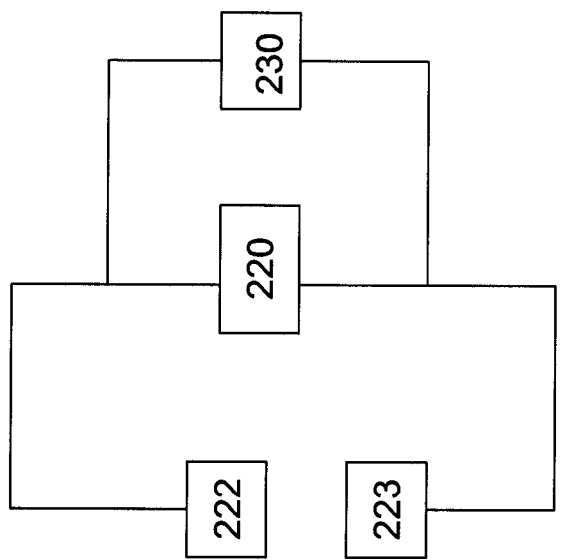
FIG. 3 is a simplified block diagram of a portion of an LED thermal protection structure according to various aspects of the present disclosure.

Continuing with FIG. 2, the PCB 210 may include a multi-layer structure. As an example, the PCB 210 includes a conductor layer 224, poles 225, an ink layer 226, an insulator layer 227, and a base layer 228. The conductor layer 224 may provide one or more electrode traces 224A that carry electrical signals (e.g., providing a voltage or current) to the LED device 220 through electrical terminals (for example terminals 222 and 223 as shown in FIGS. 3-4) with an electrical and/or physical connection to poles 225 coupled to the LED device 220. The traces 240A may be formed in the conductor layer 224 by patterning and etching techniques. The poles 225 may be differently biased (e.g., a + biased pole and a − biased poll). Through electrical terminals 222 and 223, the poles 225 may be operable to provide a voltage or current to the LED device 220 such that the LED device 220 can operate. The poles 225 may be operable to provide an electrical connection by wire bonding. The poles 225 may include gold, tin, and/or other conductive material. The ink layer 226 is disposed on a surface of the conductor layer 224 as an insulating cover for the conductor layer 224. The ink layer 226 may include solder mask ink. The insulator layer 227 may also include a dielectric polymer or another insulating material. The insulator layer 227 may include a composition selected for its high thermal conductivity (e.g., greater than 50 W/mK). The base layer 228 may act as a heat spreader. The base layer 228 may include metal and metal compounds.

In the depicted embodiment, the conductor layer 224 includes copper (e.g., a copper clad), with a thickness range of 35 μm-100 μm; the poles 225 includes chemical gold and Sn; the ink layer 226 includes solder mask ink; the insulator layer 227 includes a dielectric polymer; the base layer 228 includes copper (e.g., copper or a copper alloy). In other embodiments, the base layer 228 may include aluminum or an aluminum alloy.

In one embodiment, the PCB 210 may be connected to a heat sink (not shown in FIG. 2). The heat sink may provide for dissipation of heat generated by the LED device and other related components. In an embodiment, the heat sink includes aluminum. Other exemplary compositions include copper. An interface material may apply between the PCB 210 and the heat sink. The interface material may include a thermally conductive material. In an embodiment, the interface material is a thermally conductive gel. The interface material may have adhesion properties such that it provides bonding between the PCB and the heat sink. Alternatively, the interface material may provide an interface for thermal conduction between the PCB and the heat sink.

According to various aspects of the present disclosure, a thermistor is used to carry out protection of the LED device during high temperature operations. A thermistor is one type of resistor whose resistance varies significantly with temperature (more than standard resistors). Thermistors typically achieve a higher precision within a temperature range, such as −90° C. to 130° C. Thermistors usually are classified into two types. One type is a positive temperature coefficient (PTC) thermistor, or posistor. The resistance of the PTC thermistor increases with increasing temperature. The other type is a negative temperature coefficient (NTC) thermistor. The resistance of the NTC thermistor decreases with increasing temperature. In comparison, the resistance of the standard resistor remains nearly constant over a wide temperature range. Thermistors may be made using a ceramic or polymer material. Thermistors are widely used as inrush current limiters, temperature sensors, self-resetting overcurrent protectors, and self-regulating heating elements. In the depicted embodiment, an NTC thermistor may be used as the thermistor.

FIG. 3 illustrates a simplified diagrammatic circuit schematic view of an electrically-parallel connection between an NTC thermistor 230 and the LED device 220. When an increasing temperature is sensed by the NTC thermistor 230, the resistance of the thermistor 230 decreases, thereby leading to an increase in the current through the thermistor 230. The parallel connection between the NTC thermistor 230 and the LED device 220 means that the sum of the currents through the NTC thermistor 230 and the LED device 220 remains substantially unchanged. Therefore, a current increase in the NTC thermistor 230 is accompanied by a current reduction in the LED device 220.

The current reduction in the LED device 220 may lead to a temperature reduction in the LED device 220. The temperature reduction in the LED device 220 may further alleviate light emission degradation problems associated with a high temperature. In other words, as the temperature of the LED device 220 drops, the light emission efficiency of the LED device begins to improve. In this manner, although the LED device 220 operates at a high temperature, a more stable light output of the LED device 220 can still be achieved.

As an example, FIG. 4 includes a table 250 that illustrates a relationship between electrical current of the LED device 220 and electrical current of the NTC thermistor 230, where the LED device 220 and the NTC thermistor 230 are coupled in parallel as shown in FIG. 3. The table 250 demonstrates that, as the temperature increases, the current of the LED device 220 decreases, and the current of the NTC thermistor 230 increases correspondingly.

In order to protect the LED device 220 at high temperature operation, the temperature of the LED device 220 needs to be accurately detected. An inaccurate temperature detection of the LED device 220 may result in an over-reaction (or over-correction/compensation) situation or an under-reaction (or under-correction/compensation) situation. In an over-reaction situation, the current of the LED device 220 may be reduced, even though the LED device 220 is operating at an appropriate temperature. Consequently, light output of the LED device 220 may be degraded due to current reduction. On the other hand, in an under-reaction situation, the current of the LED device 220 is not reduced sufficiently, even though the LED device 220 is operating at a high temperature. Consequently, the LED device 220 may begin to overheat, which also degrades the light output of the LED device 220. In addition, the overheating of the LED device 220 may cause permanent damage to the LED device 220.

To accurately detect the temperature of the LED device 220, heat interference between the LED device 220 and the NTC thermistor 230 may need to be minimized. One way to achieve this is to place the NTC thermistor 230 away from the LED device 220. At the same time, the temperature/heat of LED device 220 may need to transfer efficiently to the remote NTC thermistor 230. An efficient temperature/heat transferring path may be formed by metals and metal compounds such as copper, aluminum, aluminum alloy or silver. In a PCB layout, the thermistor 230 can sense the heat from the LED device 220 through copper cladding.

Figure 5:
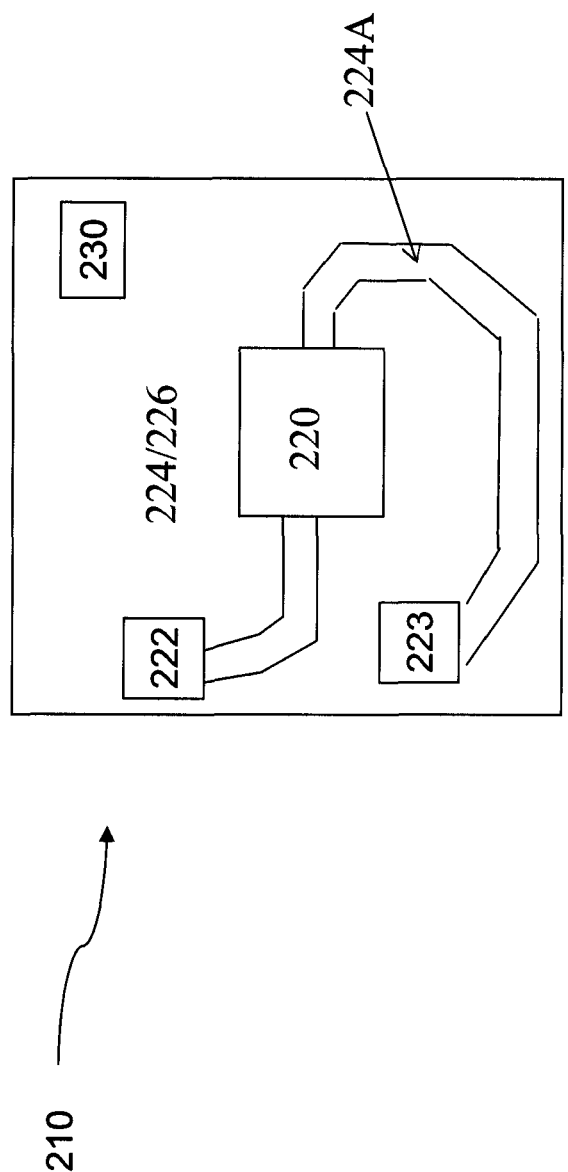
FIG. 5 is a simplified diagrammatic top view of a portion of an embodiment of an LED thermal protection structure according to various aspects of the present disclosure.

FIG. 5 illustrates a simplified diagrammatic top view of the NTC thermistor 230 and the LED device 220. The NTC thermistor 230 is coupled to the conductor layer 224 (copper clad) and is located in a region of the PCB 210 relatively far from the LED device 220. The NTC thermistor 230 and the LED device 220 may be spaced far apart enough such that the thermal energy produced by the NTC thermistor has negligible or no impact on the temperature of the LED device 220. In an embodiment, the NTC thermistor 230 is placed in or near a corner of the PCB 210 regardless of where the LED device 220 is located. In another embodiment, the NTC thermistor 230 and the LED device 220 are placed on opposite corners or sides of the PCB 210. In yet another embodiment, a distance or spacing between the NTC thermistor 230 and the LED device 220 is at least about 10 mm.

To enhance adhesion and thermal conductivity, a thermistor sensing pad may be inserted between the NTC thermistor 230 and the PCB 210. The thermistor sensing pad may include thermal interface material (TIM) such as epoxy, thermal grease, pressure-sensitive adhesive and solder.

Based on the discussions above, it can be seen that the present disclosure offers a simple and cost effective method to protect an LED device at high temperature operations. For example, the various embodiments described above achieve these objectives by coupling the NTC thermistor 230 to the LED 220 in parallel, and by placing the NTC thermistor 230 away from the LED device 220. Furthermore, through feedback and the corresponding current reduction, the LED device 220 may maintain a stable light output. Though the present disclosure illustrates a single NTC thermistor 230, it is understood that any number of NTC thermistors may be used in alternative embodiments, depending on factors such as cost, board real estate, and performance considerations. In yet other embodiments, it is understood that the PCB 210 may further include active devices such as transistors and passive devices such as resistors, capacitors, or inductors. The PCB 210 may also include multiple terminals for establishing electrical connections with other devices.

An Active Method of Protection

Figure 6:
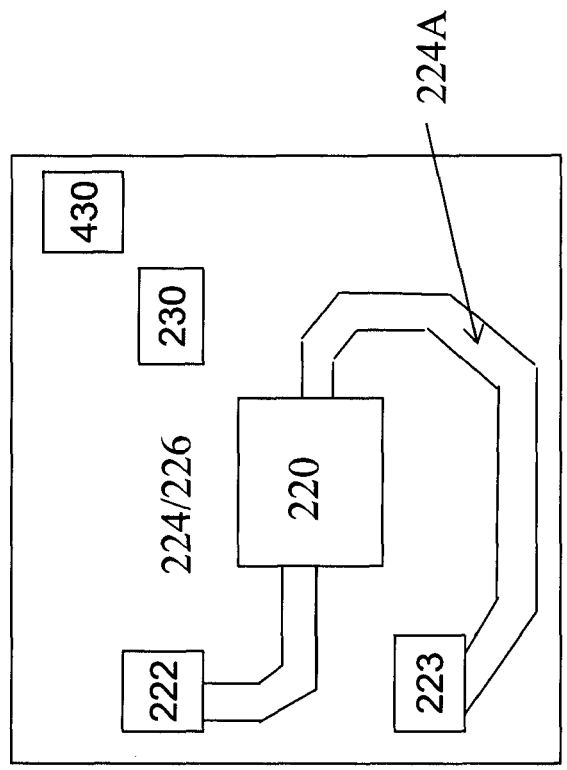
FIG. 6 is a simplified diagrammatic top view of a portion of an embodiment of an LED thermal protection structure according to various aspects of the present disclosure.
Figure 6:

FIG. 6 illustrates a diagrammatic top view a printed circuit board (PCB) 410 on which an LED device 220 is located. The PCB 410 includes a conductor layer 224, poles 225, an ink layer 226, an insulator layer 227, and a base layer 228. The formation of the conductor layer 224, poles 225, the ink layer 226, the insulator layer 227 and the base layer 228 is similar in many respects to those discussed above in association with FIG. 2. In the depicted embodiment, the conductor layer 224 includes copper (e.g., a copper clad), with a thickness range of 35 μm-100 μm; the poles 225 includes chemical gold and Sn; the ink layer 226 includes solder mask ink; the insulator layer 227 includes a dielectric polymer; the base layer 228 includes copper (e.g., copper or copper alloy).

In the depicted embodiment, the PCB 410 also includes the NTC thermistor 230. The NTC thermistor 230 is placed relatively far from the LED device 220 and is attached on the conductor layer 224, as shown in the top view in FIG. 6. An element 430 in FIG. 6 is an output terminal of an operational amplifier (Op-Amp; or Comparator), which will be described later. Through an adequate thermal conductivity of copper clad layer 224 and a location far from the LED device 220, the NTC thermistor 230 may sense temperature of the LED device 210 accurately with minimal interference from the heat generated by the NTC thermistor 230.

In one embodiment, the PCB 410 may include a plurality of components, such as transistors, resistors, capacitors, inductors, power supplies, a NTC thermistor, and Op-Amps (any passive components and active components.) The PCB 410 may also include one or more terminals for establishing electrical connections with other devices.

Figure 7:
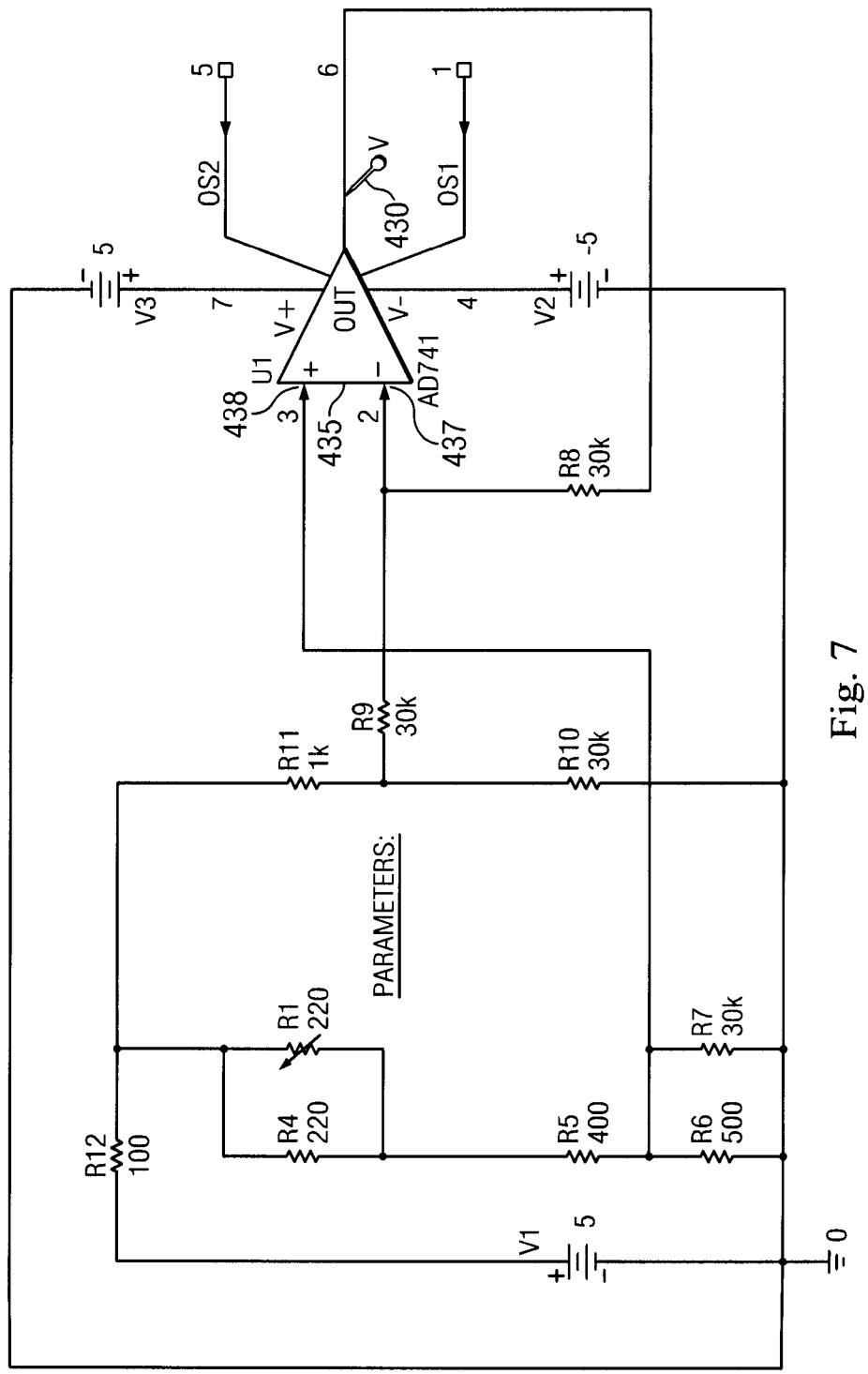
FIG. 7 is a simplified circuit diagram of a portion of an LED thermal protection structure according to various aspects of the present disclosure.

Referring to FIG. 7, a circuit schematic diagram containing an Op-Amp is illustrated. An Op-Amp is an electronic circuit device. Op-Amps can be implemented using a plurality of electronic circuit components such as transistors and resistors. An Op-Amp may be implemented using a differential amplifier and may have a high gain. An Op-Amp typically has two voltage inputs. In some embodiments, one voltage input is a fixed voltage as a reference voltage (referred to as an inverting input), and the other voltage input is a changeable voltage input (referred to as a non-inverting input).

In the depicted embodiment, an Op-Amp 435 is illustrated. The Op-Amp 435 has an inverting input 437 and a non-inverting input 438. The inverting input 437 of an Op-Amp 435 may be set at a predetermined reference voltage. The Op-Amp 435 is in a non-inverting negative feedback configuration, since its voltage output 430 is coupled to the inverting input 437 through a resistor R8. For Op-Amps in a non-inverting negative feedback configuration, the voltage output is a function of a voltage input at the non-inverting input. In other words, the voltage output rises as the voltage input rises, and the voltage output falls as the voltage input falls.

The voltage at the inverting input 437 represents a voltage that corresponds to a situation in which the LED device 220 is operating within an appropriate temperature range. When the LED device 220 is properly operating in this temperature range, the NTC thermistor (illustrated as R1 in FIG. 7) has a normal resistance value. Thus, it may be said that the predetermined voltage at the inverting input 437 of the Op-Amp 435 corresponds to the normal resistance value as well.

Meanwhile, the non-inverting input 438 of the Op-Amp 435 is electronically coupled to the NTC thermistor 230 (illustrated as R1 in FIG. 7). In steady state (i.e., during normal operation), the voltage at the non-inverting input is substantially the same as the voltage at the inverting input of the Op-Amp 435. As temperature rises, the resistance of the NTC thermistor begins to drop, and consequently the voltage at the non-inverting input 438 of the Op-Amp 435 may rise. The rising voltage at the non-inverting input 438 leads to a rising voltage output at Vout 430. Therefore, a rising temperature of the NTC thermistor 230 causes the voltage output (Vout 430) of the Op-Amp to rise as well.

As an example of the output voltage changing along with temperature in the depicted embodiment, a table of temperature vs. Vout is shown in FIG. 8. The table shows that as temperature sensed by the NTC thermistor 230 increases, the Vout 430 outputted by the Op-Amp responds with an increasing voltage as well.

Figure 9:
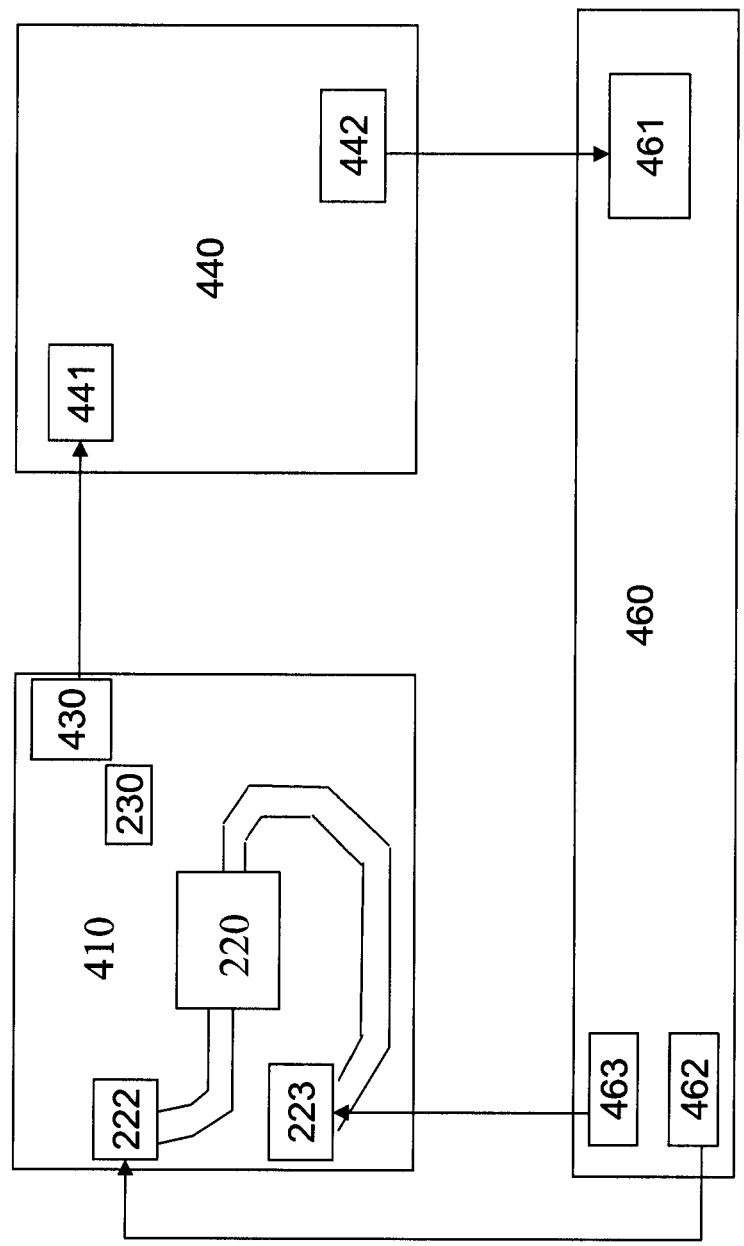
FIG. 9 is a simplified block diagram of a portion of an embodiment of an LED thermal protection structure according to various aspects of the present disclosure.

To protect the LED device 220, a modulating device may be used to form a negative feedback loop with the Op-Amp 435. This is illustrated in FIG. 9, which shows a simplified block diagram containing the PCB 410, the LED device 220, the Op-Amp device (represented by its output 430), a modulating device 440, and a current driver system 460.

The modulating device 440 may convert an analog signal to a digital signal equipped with a pulse-width modulation (PWM) technique (Or analog adjustment). The modulating device 440 may include an analog-digital-convertor (ADC), a micro-processor (MCU), an input terminal 441 and an output terminal 442. The input terminal 441 is electrically coupled to the Op-Amp voltage output terminal 430 and receives the Op-Amp voltage output. The output terminal 442 of the modulating device 440 sends an electrical signal to an input terminal 461 of the current driver system 460. Output terminals 462 and 463 of the current driver system 460 send an electrical signal to the LED device 220 through input terminals 222/223 of the PCB 410.

In the depicted embodiment, when the input terminal 441 receives an increasing voltage from the output terminal 430 of the Op-Amp, the modulating device 440 may respond with a decreasing on-duty-cycle of PWM and then output a voltage at a reduced level at the output terminal 442. The PWM on-duty-cycle is the proportion of "on" time to the regular interval or "period" of time. A low on-duty-cycle represents a decreasing "on" time portion in a regular interval, and as such results in a lower average voltage output. In one embodiment, the modulating device 440 may include active devices such as transistors and passive devices such as resistors, capacitors, or inductors.

The current driver system 460 receives the output (PWM or Analog voltage) from the modulating device 440, converts the PWM voltage to a driving current and delivers the driving current to the LED device 220 through terminals 222, 223 of the PCB 410.

In the depicted embodiment, when the NTC thermistor 230 senses increasing temperature, the Op-Amp may deliver a increasing analog voltage to the modulating device 440, and the modulating device 440 responds with a decreasing on-duty-cycle PWN digital voltage and outputs it to the current driver system 460. The current driver system 460 responds with a decreasing driving current and delivers it to the LED device 220 through the terminals 222 and 223 of the PCB 410. With the driving current decreasing, temperature of the LED device 220 may begin to drop. Hence, a negative feedback loop is formed by the thermistor 230, the LED device 220, the Op-Amp, the modulating device 440, and the current driver system 460.

If the reduced temperature of the LED 220 sensed by the NTC thermistor 230 does not meet the appropriate temperature target (by comparing with the pre-set voltage at the inverting input of the Op-Amp), another iteration of the negative feedback operation discussed above may be repeated. In actual operation, these iterations or cycles may be substantially continuous. The negative feedback loop continues to be iterated until the temperature sensed by the NTC thermistor 230 drops to the appropriate temperature.

In one embodiment, multiple LED devices may be connected in series, and the method 400 may apply to one of the LED devices and provides protection for all these LED devices at high temperatures of operation. In some embodiments, the multiple LED devices may be arranged in a group where at least one of the LED devices is located near a center of the group. In other words, at least one (or more) of the LED devices is surrounded by other LED devices. In such cases, an increasing temperature will cause the circuit to bypass these LED devices disposed in the center of the group (or surrounded by other LED devices).

In another embodiment, the passive method 100 and the active method 300 may be chosen by a switch. Through appropriate parallel connections of the LED device 220 and the NTC thermistor 230, a low cost technique to protect LED devices operating at high temperatures may be implemented. By integrating electronic devices, such as Op-Amp, modulating device and the current driver system with the LED device, the LED device could be driven safely by feedback signal at high temperatures of operation. Both techniques may improve reliability and life time of LED device and maintain a stable light output of LED devices operating at high temperatures.

The different embodiments of the LED thermal protection structures disclosed herein offer advantages over conventional LED thermal protection structures. It is understood, however, that not all advantages are necessarily discussed herein, and other embodiments of the present disclosure may offer different advantages, and that no particular advantage is required for all embodiments. One advantage is that by using a thermistor to sense the temperature of the LED device, overheating conditions of the LED device can be quickly discovered and addressed. The thermistor is placed relatively far away from the LED device so as to minimize heat interference between the thermistor and the LED device. In other words, the fact that the thermistor and the LED device are spaced apart allows the real or actual temperature of the LED device to be detected by the thermistor, rather than the thermistor detecting a temperature that is partially due to its own heat contribution.

In embodiments where a thermistor is used to share the electrical current load with the LED device, the implementation is simple and cost effective. The thermistor in a sense serves as a thermal conduit to automatically divert current (which causes heat) away from the LED device when the LED device becomes heated. In embodiments where other electrical components such as Op-Amps are used to implement a feedback structure with the LED device, the LED module can be driven safely by a feedback signal provided by the feedback structure. The current through the LED device may be more precisely regulated through the use of the feedback structure, and therefore the temperature of the LED device can also be more accurately monitored and controlled.

One of the broader forms of the present disclosure involves an LED thermal protection apparatus. The apparatus includes: a substrate; a light-emitting device disposed on a first region of the substrate; and a thermistor disposed on a second region of the substrate that is substantially spaced apart from the first region; wherein the thermistor is thermally and electrically coupled to the light-emitting device. The second region may be located near a corner region of the substrate.

According to various embodiments, the thermistor includes a negative temperature coefficient (NTC) thermistor, or is thermally coupled to the light-emitting device through a thermally conductive layer of the substrate. The thermistor may also electrically coupled to the light-emitting device in parallel. In some embodiments, the substrate includes a metal core printed circuit board (MCPCB).

Another one of the broader forms of the present disclosure involves an LED thermal protection apparatus. The apparatus includes: a substrate; a light-emitting device located on the substrate; a feedback mechanism thermally and electrically coupled to the light-emitting device, the feedback mechanism including: a thermistor operable to detect a temperature of the light-emitting device; and electronic circuit components operable to regulate an amount of electrical current flowing through the light-emitting device in response to the detected temperature.

In various embodiments, the thermistor includes a negative temperature coefficient (NTC) thermistor and/or substantially spaced apart from the light-emitting device. In an embodiment, the thermistor is located near an edge of the substrate or is spaced sufficiently far apart from the light-emitting device such that a thermal energy produced by the thermistor has a negligible impact on the temperature of the light-emitting device.

In some embodiments, the thermistor is thermally coupled to the light-emitting device through a copper clad material in the substrate. In an embodiment, the electronic circuit components are operable to reduce the amount of electrical current flowing through the light-emitting device when the temperature detected by the thermistor exceeds a predefined limit. The electronic circuit components may include an operational amplifier (Op-Amp), an analog-to-digital converter (ADC), and a microcontroller unit.

One more of the broader forms of the present disclosure involves a method of thermally protecting an LED device. The method includes: providing a substrate having a light-emitting diode (LED) die disposed thereon; detecting a temperature of the LED die using a negative temperature coefficient (NTC) thermistor, the NTC thermistor being positioned on a region of the substrate substantially away from the LED die; and adjusting an electrical current of the LED die in response to the detecting.

In certain embodiments, the detecting include thermally coupling the NTC thermistor to the LED die through a conductive layer of the substrate, and wherein the NTC thermistor is positioned at an edge region of the substrate. In some embodiments, the adjusting includes reducing the electrical current of the LED die if the temperature detected is hotter than a normal operating temperature range. In an embodiment, the adjusting is carried out using a feedback loop, the feedback loop including at least one of: the NTC thermistor, an operational amplifier (Op-Amp), and an analog-to-digital converter (ADC).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a substrate;
a light-emitting device disposed on a first region of the substrate; and
a temperature-dependent passive device disposed on a second region of the substrate,
wherein the light-emitting device is placed away from the temperature-dependent passive device to minimize thermal interference on a temperature of the light-emitting device;
wherein the temperature-dependent passive device is thermally and electrically coupled to the light-emitting device through a thermally conductive layer of the substrate so as to sense the temperature of the light-emitting device through the thermally conductive layer, and wherein a resistance of the temperature-dependent passive device decreases as temperature increases; and
wherein the temperature-dependent passive device is electrically coupled to the light-emitting device in parallel, and a first terminal of the temperature-dependent passive device is tied to a first terminal of the light-emitting device, and a second terminal of the temperature-dependent passive device is tied to a second terminal of the light-emitting device.

2. The apparatus of claim 1, wherein the temperature-dependent passive device is thermally and electrically coupled to the light-emitting device through a negative feedback mechanism.

3. The apparatus of claim 1, wherein the substrate includes a metal core printed circuit board (MCPCB).

4. The apparatus of claim 1, wherein the first region and the second region are at least 10 millimeters apart.

5. An apparatus, comprising:
a substrate;
a light-emitting device located on a first region of the substrate;
a feedback mechanism thermally and electrically coupled to the light-emitting device, the feedback mechanism including:
a thermistor operable to detect a temperature of the light-emitting device, wherein the thermistor is located on a second region of the substrate different from the first region, wherein the light-emitting device is placed away from the temperature-dependent passive device to minimize thermal interference on a temperature of the light-emitting device, and wherein a resistance of the thermistor decreases with increasing temperature; and
electronic circuit components operable to regulate an amount of electrical current flowing through the light-emitting device in response to the detected temperature;
wherein the thermistor is thermally coupled to the light-emitting device through a copper clad material in the substrate so as to sense the temperature of the light-emitting device through the copper clad material; and
wherein the thermistor is coupled to the light-emitting device in parallel, and a first terminal of the thermistor is tied to a first terminal of the light-emitting device, and a second terminal of the thermistor is tied to a second terminal of the light-emitting device.

6. The apparatus of claim 5, wherein the electronic circuit components are operable to reduce the amount of electrical current flowing through the light-emitting device when the temperature detected by the thermistor exceeds a predefined limit.

7. The apparatus of claim 5, wherein the electronic circuit components include an operational amplifier (Op-Amp), an analog-to-digital converter (ADC), and a microcontroller unit.

8. The apparatus of claim 5, wherein:
the light-emitting device includes a light-emitting diode (LED) chip; and
the substrate includes a metal core printed circuit board (MCPCB).

9. The apparatus of claim 5, wherein the first region and the second region are spaced apart by at least 10 millimeters.

10. A method, comprising:
providing a substrate having a light-emitting diode (LED) die disposed thereon;
detecting a temperature of the LED die using a negative temperature coefficient (NTC) thermistor, wherein the light-emitting diode die is placed away from the negative temperature coefficient thermistor to minimize thermal interference on a temperature of the light-emitting diode die, wherein a resistance of the NTC thermistor decreases with increasing temperature, and wherein the detecting includes sensing a temperature of the LED die through a conductive layer of the substrate; and adjusting an electrical current of the LED die in response to the detecting;

wherein the thermistor is electrically coupled to the LED die in parallel, and a first terminal of the thermistor is tied to a first terminal of the LED die, and a second terminal of the thermistor is tied to a second terminal of the LED die.

11. The method of claim 10, wherein the adjusting includes reducing the electrical current of the LED die if the temperature detected is hotter than a normal operating temperature range.

12. The method of claim 10, wherein the adjusting is carried out using a feedback loop, the feedback loop including at least one of: the NTC thermistor, an operational amplifier (Op-Amp), and an analog-to-digital converter (ADC).

13. The method of claim 10, wherein the feedback loop is a negative feedback loop.

14. The method of claim 10, wherein the NTC thermistor and the LED die are spaced apart by at least 10 millimeters.

* * * * *